(12) United States Patent
Ku et al.

(10) Patent No.: US 11,732,072 B2
(45) Date of Patent: Aug. 22, 2023

(54) NEUTRAL LAYER COMPOSITION

(71) Applicant: LG Chem, Ltd., Seoul (KR)

(72) Inventors: Se Jin Ku, Daejeon (KR); Mi Sook Lee, Daejeon (KR); Na Na Kang, Daejeon (KR); Eung Chang Lee, Daejeon (KR); Sung Soo Yoon, Daejeon (KR); No Jin Park, Daejeon (KR); Je Gwon Lee, Daejeon (KR); Eun Young Choi, Daejeon (KR); Hyung Ju Ryu, Daejeon (KR); Yoon Hyung Hur, Daejeon (KR)

(73) Assignee: LG Chem, Ltd.

( * ) Notice: Subject to any disclaimer, the term of this patent is extended or adjusted under 35 U.S.C. 154(b) by 532 days.

(21) Appl. No.: 16/630,713

(22) PCT Filed: Jul. 16, 2018

(86) PCT No.: PCT/KR2018/008018
§ 371 (c)(1),
(2) Date: Jan. 13, 2020

(87) PCT Pub. No.: WO2019/013602
PCT Pub. Date: Jan. 17, 2019

(65) Prior Publication Data
US 2020/0391490 A1 Dec. 17, 2020

(30) Foreign Application Priority Data
Jul. 14, 2017 (KR) .................. 10-2017-0089862

(51) Int. Cl.
| | |
|---|---|
| C09K 3/18 | (2006.01) |
| C08F 214/06 | (2006.01) |
| C08F 2/24 | (2006.01) |
| C08K 5/10 | (2006.01) |
| C08F 212/14 | (2006.01) |
| B32B 27/08 | (2006.01) |
| B32B 27/30 | (2006.01) |
| C08L 53/00 | (2006.01) |
| C08L 25/18 | (2006.01) |

(52) U.S. Cl.
CPC ............ *C08F 212/20* (2020.02); *B32B 27/08* (2013.01); *B32B 27/302* (2013.01); *B32B 27/308* (2013.01); *C08F 212/16* (2020.02); *C08L 25/18* (2013.01); *C08L 53/00* (2013.01); *B32B 2255/26* (2013.01); *B32B 2305/72* (2013.01); *B32B 2325/00* (2013.01); *B32B 2333/08* (2013.01); *B32B 2457/14* (2013.01); *C08L 2312/00* (2013.01)

(58) Field of Classification Search
CPC ..... B32B 27/08; B32B 27/302; B32B 27/308; B32B 2457/14; B32B 2305/72; B32B 2333/08; B32B 2325/00; B32B 2255/26; C08L 53/00
See application file for complete search history.

(56) References Cited

U.S. PATENT DOCUMENTS

| | | |
|---|---|---|
| 2012/0273460 A1 | 11/2012 | Kang et al. |
| 2013/0078576 A1 | 3/2013 | Wu et al. |
| 2014/0030652 A1* | 1/2014 | Senzaki ............... C09D 125/14 |
| | | 430/325 |
| 2015/0166821 A1 | 6/2015 | Yi et al. |
| 2016/0280832 A1 | 9/2016 | Kim et al. |
| 2016/0304653 A1 | 10/2016 | Kim et al. |
| 2018/0170023 A1 | 6/2018 | Park et al. |
| 2019/0375904 A1* | 12/2019 | Lee ..................... C08F 293/005 |

FOREIGN PATENT DOCUMENTS

| | | |
|---|---|---|
| CN | 105980342 A | 9/2016 |
| JP | 2012062365 A | 3/2012 |
| KR | 20120122655 A | 11/2012 |
| KR | 20140008296 A | 1/2014 |
| KR | 20140063790 A | 5/2014 |
| KR | 20140146881 A | 12/2014 |
| KR | 20150066488 A | 6/2015 |
| KR | 20160038700 A | 4/2016 |
| KR | 20160095137 A | 8/2016 |
| KR | 20160143579 A | 12/2016 |
| WO | 2013041958 A1 | 3/2013 |
| WO | 2015091047 A1 | 6/2015 |

OTHER PUBLICATIONS

Extended European Search Report with Written Opinion for Application No. 18832409.9 dated Apr. 29, 2020, 5 pages.
Khamatnurova et al., "Poly(4-dodecylstyrene) as a phase-selectively soluble polymer support in homogeneous catalysis". Polymer Chemistry, Jan. 1, 2013, pp. 1617-1624, vol. 4, No. 5, XP055686496.
Khamatnurova, et al., "Soluble polymer-supported hindered phosphine ligands for palladium-catalyzed aryl amination," Catalysis Science & Technology, Jan. 1, 2015, pp. 2378-2383, vol. 5, No. 4, XP055686500.
Yang, et al., "Polyethylene as a Nonvolatile Solid Cosolvent Phase for A Catalyst Separation and Recovery", Journal of the American Chemical Society, Aug. 31, 2012, pp. 14714-14717, vol. 134, No. 36, XP055686495.
International Search Report for Application No. PCT/KR2018/008018 dated Oct. 19, 2018, 3 pages.

(Continued)

*Primary Examiner* — Robert D Harlan
(74) *Attorney, Agent, or Firm* — Lerner David LLP

(57) ABSTRACT

A neutral layer composition and a neutral layer formed from the same are disclosed herein. In some embodiments, a neutral layer composition includes a random copolymer having a unit represented by Formula 1, and a unit containing an aromatic structure having one or more halogen atoms, wherein the molar amount of the unit represented by Formula 1 is present in a range of 9 mol % to 32 mol %, based on the total molar amount of the copolymer. The neutral layer can effectively control orientation characteristics of various block copolymers deposited thereon.

17 Claims, 5 Drawing Sheets

(56) References Cited

OTHER PUBLICATIONS

Search Report dated Jan. 21, 2022 from the Office Action for Chinese Application No. 201880046248.8 dated Jan. 27, 2022, pp. 1-4.

* cited by examiner

NEUTRAL LAYER COMPOSITION

CROSS-REFERENCE TO RELATED APPLICATION(S)

The present application is a national phase entry under 35 U.S.C. § 371 of International Application No. PCT/KR2018/008018, filed on Jul. 16, 2018, which claims priority from Korean Patent Application No. 10-2017-0089862, filed on Jul. 14, 2017, the disclosures of which are incorporated herein by reference.

TECHNICAL FIELD

The present application relates to a neutral layer composition.

BACKGROUND ART

Block copolymers in which two or more chemically different polymer chains are linked by covalent bonds can be separated into regular microphases. The fine phase separation phenomenon of such block copolymers is generally explained by volume fractions, molecular weights and mutual attraction coefficients (Flory-Huggins interaction parameter) among constituents. There are various structures such as nan-scale spheres, cylinders, gyroids or lamellae in the microphase formed by the block copolymer.

An important issue in practical application of block copolymers is to regulate orientation of the microphases. Orientation characteristics of the block copolymers may include a horizontal orientation in which orientation of nanostructures is parallel to the substrate direction and a vertical orientation in which the orientation of the nanostructures is vertical to the substrate direction, among which the vertical orientation is often more important than the vertical orientation.

The orientation of the nanostructures can be determined by selective wetting of blocks in the block copolymer, where a number of substrates are polar and the air is non-polar, so that among blocks of the block copolymer, the blocks with greater polarity are wetted on the substrate and the blocks with smaller polarity are wetted at the interface with the air, and thus the horizontal orientation is induced.

DISCLOSURE

Technical Problem

Figure 1:
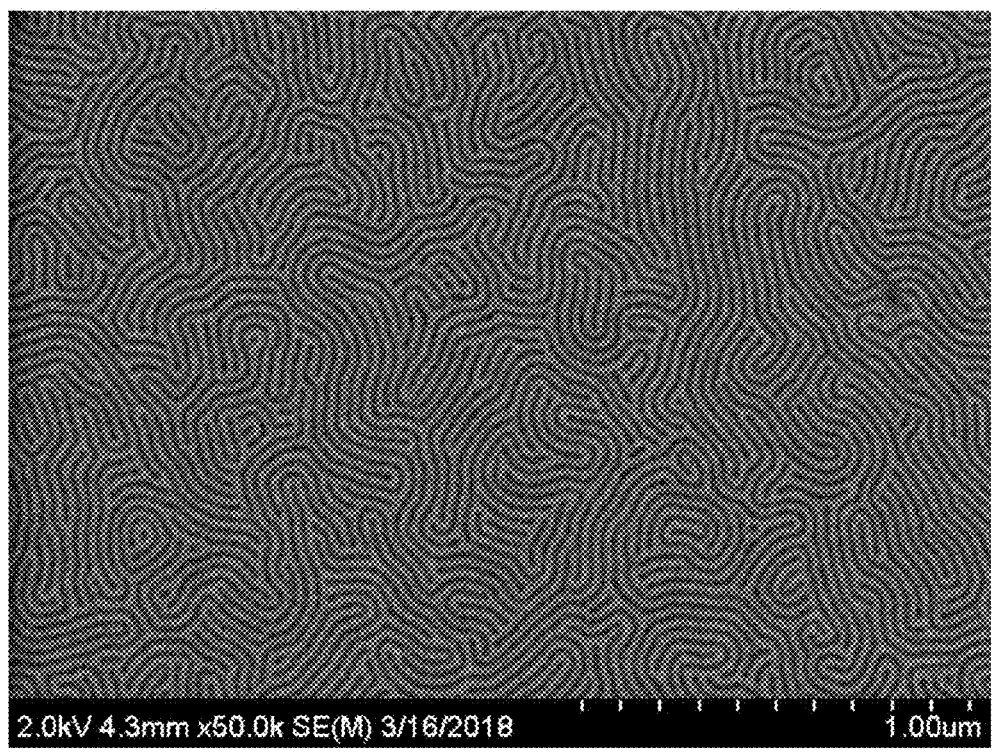
FIGS. 1 to 6 are SEM images of the block copolymer membranes formed in Examples 1 to 6, respectively.

The present application provides a neutral layer composition. It is one object of the present application to provide a neutral layer composition capable of forming a neutral layer that effectively controls orientation characteristics such as a vertical orientation of a block copolymer deposited thereon.

Technical Solution

In this specification, the term alkyl group may mean an alkyl group having 1 to 20 carbon atoms, 1 to 16 carbon atoms, 1 to 12 carbon atoms, 1 to 8 carbon atoms or 1 to 4 carbon atoms, unless otherwise specified. The alkyl group may be a linear, branched or cyclic alkyl group and may be optionally substituted by one or more substituents.

In this specification, the term alkoxy group may mean an alkoxy group having 1 to 20 carbon atoms, 1 to 16 carbon atoms, 1 to 12 carbon atoms, 1 to 8 carbon atoms or 1 to 4 carbon atoms, unless otherwise specified. The alkoxy group may be a linear, branched or cyclic alkoxy group and may optionally be substituted by one or more substituents.

The term alkenyl group or alkynyl group herein may mean an alkenyl group or alkynyl group having 2 to 20 carbon atoms, 2 to 16 carbon atoms, 2 to 12 carbon atoms, 2 to 8 carbon atoms or 2 to 4 carbon atoms, unless otherwise specified. The alkenyl group or alkynyl group may be linear, branched or cyclic and may optionally be substituted by one or more substituents.

In this specification, the term alkylene group may mean an alkylene group having 1 to 20 carbon atoms, 1 to 16 carbon atoms, 1 to 12 carbon atoms, 1 to 8 carbon atoms, or 1 to 4 carbon atoms, unless otherwise specified. The alkylene group may be a linear, branched or cyclic alkylene group and may optionally be substituted by one or more substituents.

The term alkenylene group or alkynylene group herein may mean an alkenylene group or alkynylene group having 2 to 20 carbon atoms, 2 to 16 carbon atoms, 2 to 12 carbon atoms, 2 to 8 carbon atoms or 2 to 4 carbon atoms, unless otherwise specified. The alkenylene group or alkynylene group may be linear, branched or cyclic and may optionally be substituted by one or more substituents.

The term aryl group or arylene group herein may mean, unless otherwise specified, a monovalent or divalent residue derived from a compound comprising one benzene ring structure or a structure in which two or more benzene rings are linked while sharing one or two carbon atoms, or linked by any linker, or a derivative thereof. The aryl group or the arylene group may be, for example, an aryl group having 6 to 30 carbon atoms, 6 to 25 carbon atoms, 6 to 21 carbon atoms, 6 to 18 carbon atoms or 6 to 13 carbon atoms, unless otherwise specified.

In the present disclosure, the term aromatic structure may mean the aryl group or the arylene group.

In this specification, the term alicyclic ring structure means a cyclic hydrocarbon structure other than an aromatic ring structure, unless otherwise specified. The alicyclic ring structure may be, for example, an alicyclic ring structure having 3 to 30 carbon atoms, 3 to 25 carbon atoms, 3 to 21 carbon atoms, 3 to 18 carbon atoms, or 3 to 13 carbon atoms, unless otherwise specified.

In the present disclosure, the term single bond may mean a case where no separate atom is present at the relevant site. For example, in the structure represented by A-B-C, when B is a single bond, it means that no atom exists at a site represented by B, and A is directly connected to C to form a structure represented by A-C.

In the present disclosure, the substituent which may optionally be substituted in an alkyl group, an alkenyl group, an alkynyl group, an alkylene group, an alkenylene group, an alkynylene group, an alkoxy group, an aryl group, an arylene group, a chain or an aromatic structure, and the like can be exemplified by a hydroxyl group, a halogen atom, a carboxyl group, a glycidyl group, an acryloyl group, a methacryloyl group, an acryloyloxy group, a methacryloyloxy group, a thiol group, an alkyl group, an alkenyl group, alkynyl group, an alkylene group, an alkenylene group, an alkynylene group, an alkoxy group or an aryl group, and the like, but is not limited thereto.

The present disclosure relates to a neutral layer composition. The term neutral layer composition may mean a composition used for forming a neutral layer. In the present disclosure, the term neutral layer may mean any kind of layer capable of inducing a vertical orientation of a block copolymer. The meaning of the term vertical orientation of block copolymer is well known in the art, and for example, it may mean a case where the block copolymer forms a phase separation structure and the interface of the blocks forming the phase separation structure is formed substantially perpendicular to a substrate.

The neutral layer composition of the present disclosure may comprise a certain random copolymer. The random copolymer may comprise a unit represented by Formula 1 below; and a unit having an aromatic structure containing one or more halogen atoms.

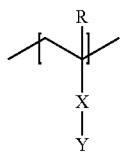

[Formula 1]

In Formula 1, R is hydrogen or an alkyl group having 1 to 4 carbon atoms, X is a single bond, an oxygen atom, a sulfur atom, —S(=O)$_2$—, a carbonyl group, an alkylene group, an alkenylene group, an alkynylene group, —C(=O)—X$_1$— or —X$_1$—C(=O)—, where X$_1$ is an oxygen atom, a sulfur atom, —S(=O)$_2$—, an alkylene group, an alkenylene group or an alkynylene group, and Y is a monovalent substituent including a ring structure to which a chain having 8 or more chain-forming atoms is connected. In one example, Y may be a monovalent substituent, which is a ring structure in which the chain is substituted.

In another example, X in Formula 1 may be an oxygen atom, a carbonyl group, —C(=O)—O— or —O—C(=O)—, or may be —C(=O)—O—, but is not limited thereto.

The monovalent substituent, which is Y in Formula 1, comprises a chain formed by at least eight chain-forming atoms.

In the present disclosure, the term chain-forming atom means an atom forming a linear structure of a predetermined chain. The chain may be linear or branched, but the number of chain-forming atoms is calculated by only the number of atoms forming the longest linear chain and other atoms bonded to the chain-forming atoms (for example, if the chain-forming atoms are carbon atoms, hydrogen atoms bonding to the carbon atoms and the like) are not calculated. Also, in the case of a branched chain, the number of chain-forming atoms can be calculated as the number of chain-forming atoms forming the longest chain. For example, when the chain is an n-pentyl group, all of the chain-forming atoms are carbon, where the number is 5, and even if the chain is a 2-methylpentyl group, all of the chain-forming atoms are carbon, where the number is 5. The chain-forming atom may be exemplified by carbon, oxygen, sulfur or nitrogen, and the like, and an appropriate chain-forming atom may be carbon, oxygen or nitrogen, or may be carbon or oxygen. The number of chain-forming atoms may be 8 or more, 9 or more, 10 or more, 11 or more, or 12 or more. The number of the chain forming atoms may also be 30 or less, 25 or less, 20 or less, or 16 or less.

The random copolymer comprising a unit of Formula 1 can be effectively applied for applications that induce vertical orientation of various block copolymers. For example, the random copolymer can effectively form a neutral layer capable of inducing the vertical orientation of the block copolymer including the block of the unit of Formula 1 or the block of the unit having the similar structure thereto, as described below. In the present application, the term vertical orientation indicates orientation characteristics of the block copolymer, where the orientation of the nanostructure formed by the block copolymer may mean orientation perpendicular to the substrate direction.

In one example, the chain may be a linear hydrocarbon chain such as a linear alkyl group, alkenyl group or alkynyl group. In this case, the alkyl group, alkenyl group or alkynyl group may be an alkyl group, alkenyl group or alkynyl group, and the like having 8 or more carbon atoms, 8 to 30 carbon atoms, 8 to 25 carbon atoms, 8 to 20 carbon atoms or 8 to 16 carbon atoms. One or more carbon atoms of the alkyl group may be optionally substituted with an oxygen atom, and at least one hydrogen atom of the alkyl group and the like may be optionally substituted with another substituent.

In Formula 1, Y is a primary substituent containing a ring structure or a monovalent substituent which is a ring structure, where the chain may be connected to the ring structure. When a block copolymer, which is described below, has been formed by such a ring structure, the vertical orientation of the block copolymer can be induced. The ring structure may be an aromatic structure, or may be an alicyclic structure.

The chain may be directly connected to the ring structure, or may be connected via a linker. The linker may be exemplified by an oxygen atom, a sulfur atom, —NR$_1$—, S(=O)$_2$—, a carbonyl group, an alkylene group, an alkenylene group, an alkynylene group, —C(=O)—X$_1$— or —X$_1$—C(=O)—, where R$_1$ may be hydrogen, an alkyl group, an alkenyl group, an alkynyl group, an alkoxy group or an aryl group, X$_1$ may be a single bond, an oxygen atom, a sulfur atom, —NR$_2$—, —S(=O)$_2$—, an alkylene group, an alkenylene group or an alkynylene group. In addition, here, R$_2$ may be hydrogen, an alkyl group, an alkenyl group, an alkynyl group, an alkoxy group or an aryl group. An appropriate linker may be exemplified by an oxygen atom or a nitrogen atom. The chain may be connected to a ring structure, which is an aromatic structure or an alicyclic structure, via, for example, an oxygen atom or a nitrogen atom. In this case, the linker may be an oxygen atom, or may be —NR$_1$— (where R$_1$ is hydrogen, an alkyl group, an alkenyl group, an alkynyl group, an alkoxy group or an aryl group).

In one example, the unit represented by Formula 1 above may be represented by, for example, Formula 2 below.

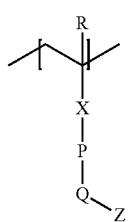

[Formula 2]

In Formula 2, R is hydrogen or an alkyl group having 1 to 4 carbon atoms, X is a single bond, an oxygen atom, a carbonyl group, —C(=O)—O— or —O—C(=O)—, P is an arylene group, Q is an oxygen atom or —NR$_3$—, where R$_3$ is hydrogen, an alkyl group, an alkenyl group, an alkynyl group, an alkoxy group or an aryl group, and Z is a chain having 8 or more chain-forming atoms. In another example, Q in Formula 2 may be an oxygen atom.

In another example, the unit represented by Formula 1 may be represented by Formula 3 below.

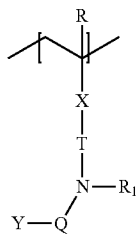

[Formula 3]

In Formula 3, R$_1$ and R$_2$ are each independently hydrogen or an alkyl group having 1 to 4 carbon atoms, X is a single bond, an oxygen atom, a sulfur atom, —S(=O)$_2$—, a carbonyl group, an alkylene group, an alkenylene group, an alkynylene group, —C(=O)—X$_1$— or —X$_1$—C(=O)—, where X$_1$ is a single bond, an oxygen atom, a sulfur atom, —S(=O)$_2$—, an alkylene group or an alkynylene group, T is a single bond or an arylene group, Q is a single bond or a carbonyl group, and Y is a chain having 8 or more chain-forming atoms.

In Formula 3 above, X may be a single bond, an oxygen atom, a carbonyl group, —C(=O)—O— or —O—C(=O)—. As a specific example of the chain of Y, the contents described in Formula 1 may be similarly applied.

In the random copolymer, the molar amount of the unit of Formula 1 may be 32 mol % or less based on the total copolymer. This amount can be adjusted, for example, according to the kind of the block copolymer to be deposited on the neutral layer. In one example, the molar amount of the unit of Formula 1 above in the random copolymer may be 32 mol % or less, 31 mol % or less, 30 mol % or less, 29 mol % less, or 28 mol % or less, and may be 9 mol % or more, 10 mol % or more, or 11 mol % or more. The present inventors have confirmed that the molar amount of the unit of Formula 1 contained in the random copolymer can exhibit neutral properties in the above range. As the random copolymer comprises the unit of Formula 1 in the range satisfying the above molar amount, the neutral layer formed of the neutral layer composition of the present disclosure may further comprise a functional monomer to be described below, while effectively inducing the vertical orientation of the block copolymer, thereby improving the bonding force between the block copolymer and the neutral layer and the adhesion between the neutral layer and the substrate.

The unit having an aromatic structure containing one or more halogen atoms contained in the random copolymer may be a unit represented by Formula 4 below.

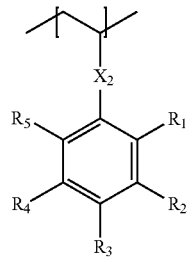

[Formula 4]

In Formula 4, X$_2$ is a single bond, an oxygen atom, a sulfur atom, —S(=O)$_2$—, an alkylene group, an alkenylene group, an alkynylene group, —C(=O)—X$_1$— or —X$_1$—C(=O)$_2$—, where X$_1$ is a single bond, an oxygen atom, a sulfur atom, —S(=O)$_2$—, an alkylene group, an alkenylene group or an alkynylene group, and R$_1$ to R$_5$ are each independently hydrogen, an alkyl group, a haloalkyl group or a halogen atom, where the number of halogen atoms contained in R$_1$ to R$_5$ is one or more.

In another example, X$_2$ in Formula 4 may be a single bond, an oxygen atom, an alkylene group, —C(=O)—O— or —O—C(=O)—.

In Formula 4, R$_1$ to R$_5$ are each independently hydrogen, an alkyl group, a haloalkyl group or a halogen atom, provided that R$_1$ to R$_5$ may comprise 1 or more, 2 or more, 3 or more, 4 or more, or 5 or more halogen atoms. The halogen atoms contained in R$_1$ to R$_5$ may be 10 or less, 9 or less, 8 or less, 7 or less, or 6 or less. In another example, 1 or more, 2 or more, 3 or more, 4 or more, or 5 of the R$_1$ to R$_5$ may be halogen atoms. In this case, the upper limit of R$_1$ to R$_5$ which may be halogen atoms is 5.

In one example, the ratio (A/D) of the number of moles (D) of the unit represented by Formula 1 and the number of moles (A) of the unit having an aromatic structure having one or more halogen atoms may be in a range of 2 to 10. The ratio (A/D) may be 2.00 or more, 2.04 or more, 2.08 or more, 2.12 or more, 2.16 or more, 2.20 or more, 2.24 or more, 2.28 or more, 2.32 or more, 2.36 or more, 2.4 or more, 2.44 or more, or 2.48 or more, but is not limited thereto. The ratio (A/D) may be 10 or less, 9.8 or less, 9.6 or less, 9.4 or less, 9.2 or less, 9.0 or less, 8.8 or less, 8.6 or less, 8.4 or less, 8.2 or less, 8.0 or less, 7.8 or less, 7.6 or less, 7.4 or less, 7.2 or less, 7.0 or less, 6.8 or less, or 6.6 or less, but is not limited thereto. As the unit represented by Formula 1 and the unit having an aromatic structure containing one or more halogen atoms satisfy the ratio of the number of moles in the above range, it can be possible to form a suitable neutral surface.

The random copolymer of the present application may further comprise a unit containing a crosslinkable functional group. The crosslinkable functional group may include, for example, a hydroxyl group, an epoxy group, an isocyanate group, a glycidyl group, a substituent of Formula 5 below, a benzoylphenoxy group, an alkenyloxycarbonyl group, a (meth)acryloyl group or an alkenyloxyalkyl group, and the like.

  [Formula 5]

In Formula 5, Y is a single bond, an alkylene group, an alkenylene group or an alkynylene group, and X is a single bond, an oxygen atom, a sulfur atom, —S(=O)$_2$—, an alkylene group, an alkenylene group, alkynylene group, —C(=O)—X$_1$— or —X$_1$—C(=O)—, where X$_1$ is a single bond, an oxygen atom, a sulfur atom, —S(=O)$_2$—, an alkylene group, an alkenylene group or an alkynylene group.

The functional group of Formula 5 is a substituent in which a cross-linkable azide residue is present at the terminal ($N_3$), and such a functional group can be cross-linked.

In another example, Y in Formula 5 may be an alkylene group having 1 to 20 carbon atoms, 1 to 16 carbon atoms, 1 to 12 carbon atoms, 1 to 8 carbon atoms, or 1 to 4 carbon atoms.

Also, in another example, X in Formula 5 may be a single bond, an oxygen atom, —C(=O)—O— or —O—C(=O)—, but is not limited thereto.

The unit containing a crosslinkable functional group can be exemplified by any one of the units represented by Formulas 6 to 9.

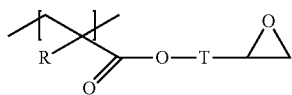

[Formula 6]

In Formula 6, R is hydrogen or an alkyl group, and T is a single bond or a divalent hydrocarbon group containing or not containing a hetero atom.

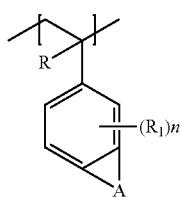

[Formula 7]

In Formula 7, R is hydrogen or an alkyl group, A is an alkylene group, $R_1$ may be hydrogen, a halogen atom, an alkyl group or a haloalkyl group, and n is a number in a range of 1 to 3.

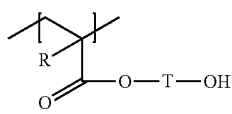

[Formula 8]

In Formula 8, R is hydrogen or an alkyl group, and T is a divalent hydrocarbon group containing or not containing a hetero atom.

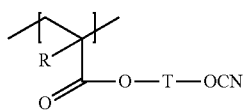

[Formula 9]

In Formula 9, R is hydrogen or an alkyl group having 1 to 4 carbon atoms, and T is a divalent hydrocarbon group containing or not containing a hetero atom.

In another example, the alkyl group in Formulas 6 to 9 may be an alkyl group having 1 to 20 carbon atoms, 1 to 16 carbon atoms, 1 to 12 carbon atoms, 1 to 8 carbon atoms or 1 to 4 carbon atoms. Such an alkyl group may be linear, branched or cyclic and may optionally be substituted by one or more of the above-described substituents.

The haloalkyl group in Formula 7 is an alkyl group in which at least one hydrogen atom is substituted with a halogen atom, where the alkyl group may be an alkyl group having 1 to 20 carbon atoms, 1 to 16 carbon atoms, 1 to 12 carbon atoms, 1 to 8 carbon atoms, or 1 to 4 carbon atoms. Such a haloalkyl group may be linear, branched or cyclic and may optionally be substituted by one or more of the foregoing substituents. Here, as the halogen atom with which the hydrogen atom is substituted, fluorine or chlorine and the like can be also exemplified.

In another example, the alkylene group of A in Formula 7 may be an alkylene group having 1 to 20 carbon atoms, 1 to 16 carbon atoms, 1 to 12 carbon atoms, 1 to 8 carbon atoms, or 1 to 4 carbon atoms. Such an alkylene group may be linear, branched or cyclic and may optionally be substituted by one or more of the foregoing substituents.

The basic definition of the divalent hydrocarbon group in Formulas 6 to 9 is as described above. The divalent hydrocarbon group of Formulas 6 to 9 may further include a hetero atom, if necessary. Here, the hetero atom is a hetero atom for carbon, and for example, includes oxygen, nitrogen or sulfur, and the like. 1 to 4 or less of such hetero atoms may be included in the divalent hydrocarbon group of Formulas 6 to 9.

Examples of the monomers capable of forming the units of Formulas 6 to 9 are not particularly limited. For example, as the monomer capable of forming the unit of Formula 6, glycidyl (meth)acrylate and the like can be exemplified, as the monomer capable of forming the unit of Formula 7, 4-vinylbenzocyclobutene and the like can be exemplified, as the monomer capable of forming the unit of Formula 8, 2-isocyanatoethyl acrylate, 2-isocyanatoethyl (meth)acrylate, 4-isocyanatobutyl acrylate or 4-isocyanatobutyl (meth)acrylate and the like can be exemplified, as the monomer capable of forming the unit of Formula 9, hydroxymethyl acrylate, hydroxymethyl (meth)acrylate, 2-hydroxyethyl acrylate, 2-hydroxyethyl (meth)acrylate, 2-hydroxypropyl acrylate, 2-hydroxypropyl (meth)acrylate, 3-hydroxypropyl acrylate, 3-hydroxypropyl (meth)acrylate, 2-hydroxybutyl acrylate, 2-hydroxybutyl (meth)acrylate, 4-hydroxybutyl acrylate, 4-hydroxybutyl (meth)acrylate, 6-hydroxyhexyl acrylate or 6-hydroxyhexyl (meth)acrylate and the like can be exemplified, without being limited thereto.

As the random copolymer comprises the unit containing a crosslinkable functional group, the durability of the neutral layer formed of the neutral layer composition can be improved, a block copolymer upper layer thin film can be wet-coated on the neutral layer, and the durability of the laminate, which is described below, can be improved.

The random copolymer may comprise an additional unit together with the unit of Formula 1, the unit of Formula 4 and the unit containing a crosslinkable functional group. The additional unit included in the random copolymer may include functional monomers having various functional groups, where the functional monomer may be appropriately selected according to physical properties required for the neutral layer containing the random copolymer. The functional monomer may include, for example, a monomer capable of improving adhesion to improve adhesion between the neutral layer and the substrate as an additional unit, but is not limited thereto.

In one example, in order to improve the adhesion between the neutral layer and the substrate, the additional unit may be a unit containing a urethane-based acrylate, an oxetane-based acrylate, a polyester-based acrylate, or a silicone-based acrylate, a heterocyclic moiety or a hydrophilic group, and as a specific example, maleic anhydride, gamma-butyrolactone (meth)acrylate, N-vinylpyrrolidone, N-vinylphthalimide, N-succinimidyl acrylate, norbornene lactone (meth)acrylate, (meth)acrylic acid, acrylamide, N-methylol acrylamide, or N-phenyl acrylamide, and the like may be included, without being limited thereto.

When the random copolymer comprises a unit containing a crosslinkable functional group and/or an additional unit, the unit containing a crosslinkable functional group and/or the additional unit may be contained in an amount of 40 mol % or less based on the entire copolymer. This amount can be adjusted, for example, according to the adhesion or the like required for the neutral layer. In one example, the amount of the unit containing a crosslinkable functional group and/or the additional unit in the random copolymer may be 38 mol % or less, 36 mol % or less, 34 mol % or less, 32 mol % or less, or 30 mol % or less, and may be 1 mol % or more, 2 mol % or more, 5 mol % or more, 10 mol % or more, 15 mol % or more, 20 mol % or more, 25 mol % or more, or 30 mol % or more, but is not limited thereto. As the random copolymer comprises the unit containing a crosslinkable functional group and/or the additional unit in the range of the above ratio, while the neutral layer formed by the neutral layer composition of the present application effectively induces the vertical orientation of the block copolymer, the coating property of the block copolymer can be increased and the adhesion between the neutral layer and the substrate can be improved because of the unit containing a crosslinkable functional group and/or the additional unit.

In one example of the present application, the ratio (C/D) of the number of moles (D) of the unit represented by Formula 1 and the number of moles (C) of the monomer unit having the crosslinkable functional group may be in a range of 0.05 to 4. The ratio (C/D) may be 0.050 or more, 0.052 or more, 0.054 or more, 0.056 or more, 0.058 or more, 0.060 or more, 0.062 or more, 0.064 or more, or 0.066 or more, but is not limited thereto. The ratio (C/D) may be 4 or less, 3.9 or less, 3.8 or less, 3.7 or less, 3.6 or less, 3.5 or less, 3.4 or less, 3.3 or less, 3.2 or less, 3.1 or less or 3.0 or less, but is not limited thereto. As the unit represented by Formula 1 and the monomer unit having a crosslinkable functional group satisfy the ratio of the number of moles in the above range, the adhesion between the neutral layer and the substrate can be increased while inducing the vertical orientation of the block copolymer.

The random copolymer may have a number average molecular weight (Mn) in a range of, for example, 2,000 to 500,000. In another example, the number average molecular weight may be 3,000 or more, 4,000 or more, 5,000 or more, 6,000 or more, 7,000 or more, 8,000 or more, 9,000 or more, 10,000 or more, 20,000 or more, 30,000 or more, 40,000 or more, 50,000 or more, 60,000 or more, 70,000 or more, 80,000 or more, 90,000 or more, or about 100,000 or more or so. In another example, the number average molecular weight may be about 400,000 or less, 300,000 or less, 200,000 or less, 100,000 or less, 90,000 or less, 80,000 or less, 70,000 or less, or 60,000 or less or so. In this specification, the term number average molecular weight is a value converted to standard polystyrene measured by using GPC (gel permeation chromatograph), and the term molecular weight means a number average molecular weight, unless otherwise specified. The molecular weight of the random copolymer can be adjusted in consideration of the physical properties and the like of the neutral layer comprising the random copolymer. In addition, unless otherwise specified, the unit of the number average molecular weight is g/mol.

The method for producing the random copolymer is not particularly limited. For example, the random copolymer may be prepared by applying a free radical polymerization method or an LRP (Living Radical Polymerization) method and the like. As an example of the LRP method, anion polymerization in which polymerization is carried out in the presence of an inorganic acid salt such as an alkali metal or alkaline earth metal salt or an organoaluminum compound using an organic rare earth metal complex or an organic alkali metal compound as an initiator, an atom transfer radical polymerization method (ATRP) using an atom transfer radical polymerization agent as a polymerization inhibitor, an ARGET (Activators Regenerated by Electron Transfer) atom transfer radical polymerization method (ATRP), which uses an atom transfer radical polymerization agent as a polymerization initiator, but performs polymerization under an organic or inorganic reducing agent that generates electrons, an ICAR (Initiators for Continuous Activator Regeneration) atom transfer radical polymerization method, a polymerization method by reversible addition-fragmentation chain transfer (RAFT) using an inorganic reducing agent and a reversible addition-fragmentation chain transfer agent or a method of using an organotellurium compound as an initiator, and the like can be exemplified, and a suitable method may be employed among the above methods.

The kind of the radical initiator that can be used in the polymerization process is not particularly limited. For example, an azo initiator such as AIBN (azobisisobutyronitrile) or 2,2'-azobis-(2,4-dimethylvaleronitrile), ABCN (1,1'-azobis(cyclohexanecarbonitrile)) or a peroxide initiator such as BPO (benzoyl peroxide) or DTBP (di-tert-butyl peroxide) may be applied, and for example, like a method using thermal self initiation of a styrenic monomer, a polymerization method using no initiator may be also applied depending on the type of the monomer.

The polymerization process can be carried out, for example, in a suitable solvent, and in this case, as an applicable solvent, a solvent such as methylene chloride, 1,2-dichloroethane, chlorobenzene, dichlorobenzene, benzene, toluene, anisole, acetone, chloroform, tetrahydrofuran, dioxane, monoglyme, diglyme, dimethylformamide, dimethylsulfoxide or dimethylacetamide can be exemplified, but is not limited thereto. After forming the random copolymer, the random copolymer can be obtained by precipitation using a non-solvent, where as the usable non-solvent, an alcohol such as methanol, ethanol, n-propanol or isopropanol, a glycol such as ethylene glycol, an ether solvent such as n-hexane, cyclohexane, n-heptane or petroleum ether, and the like can be exemplified, but is not limited thereto.

In the field of polymer synthesis, a method for producing a polymer by performing polymerization depending on a monomer forming the polymer is known, and any of the above methods may be applied upon producing the random copolymer of the present application.

The neutral layer composition comprising the random copolymer as described above may comprise only the predetermined random copolymer or, if necessary, other components in addition to the random copolymer. The neutral layer composition may comprise at least the random copolymer as the main component. The inclusion as the main component herein may mean that the corresponding composition comprises only the random copolymer, or comprises 50 wt % or more, 55 wt % or more, 60 wt % or more, 65 wt % or more, 70 wt % or more, 75 wt % or more, 80 wt % or more, 85 wt % or more, or 90 wt % or more. In another example, the ratio may be about 100 wt % or less or about 99 wt % or less or so. In addition, as other components that can be included together with the random copolymer, for example, initiators such as thermal initiators or photoinitiators or crosslinkers necessary when the random copolymer contains the above-mentioned crosslinkable functional group, and the like can be exemplified.

The present disclosure also relates to a neutral layer comprising the random copolymer. In the present disclosure, the term neutral layer means a layer capable of inducing the vertical orientation of the block copolymer as described above.

The neutral layer may be formed on a suitable substrate. As the substrate on which the neutral layer is formed, a silicon wafer, a silicon oxide substrate, a silicon nitride substrate, or a cross-linked PET (poly(ethylene terephthalate)) film, and the like can be exemplified, but is not limited thereto.

The neutral layer can be formed using the above-described neutral layer composition. For example, the process of forming the neutral layer may comprise steps of coating the neutral layer composition on the substrate and fixing the layer of the coated neutral layer composition. Here, the method for coating the neutral layer composition on the substrate is not particularly limited, and for example, a method such as bar coating, spin coating or comma coating may be applied, and coating by a roll-to-roll method may be also applied.

In addition, the method for fixing the layer of the neutral layer composition is not particularly limited, and for example, a method for inducing covalent bonds between the layer and the substrate by a suitable manner or inducing a chemical cross-linking reaction in the layer, and the like may be applied. For example, when the above process is performed by heat treatment, the heat treatment may be controlled within a range of about 100° C. to 250° C. or about 100° C. to 200° C. Also, the time required for the heat treatment may be varied as needed, and may be adjusted, for example, within a range of about 1 minute to 72 hours or about 1 minute to 24 hours. The temperature and time of the heat treatment may be adjusted to an appropriate level in consideration of the type of the functional group of the random copolymer in the neutral layer composition, and the like.

The neutral layer may have, for example, a thickness of about 2 nm to 100 nm, and in another example, it may have a thickness of about 2 nm to 50 nm. Within the thickness range, there may be benefits that the surface uniformity of the neutral layer can be maintained, the vertical orientation of the block copolymer can be induced, and then etching selectivity cannot be damaged during the etching process.

The present application also relates to a laminate comprising a neutral layer comprising the random copolymer, and a polymer membrane formed on one surface of the neutral layer and comprising a block copolymer having a first block and a second block chemically distinct from the first block.

The polymer membrane in the above laminate may be used in various applications, and for example, may be used in various electron or electronic elements, a process of forming the pattern or a recording medium such as a magnetic storage medium and a flash memory or a biosensor and the like, or a process of manufacturing a separation membrane, and the like.

In one example, the block copolymer in the polymer membrane may embody a cyclic structure, including a sphere, a cylinder, a gyroid or a lamellar, and the like through self-assembly. In the case of the sphere or the lamella of the above structures, the block copolymer may be in a vertically oriented state.

For example, in the segments of the first or second block or other blocks covalently bonded thereto in the block copolymer, other segments may be vertically oriented, while forming a regular structure such as a lamellar shape or a cylinder shape.

The block copolymer that can be included in the polymer membrane in the above-described laminate is not particularly limited.

For example, the block copolymer may comprise the above-described repeating unit represented by Formula 1 as the first block, or may comprise the first block consisting of the repeating unit.

Since the block copolymer including the block comprising the repeating unit of Formula 1 above or consisting of the unit has some degree of vertical alignment per se, the vertical orientation may be performed even when there is no neutral layer. However, the present inventors have confirmed that if the molecular weight of the block copolymer is too high, the vertical orientation property is deteriorated even when the block copolymer comprises the block comprising the repeating unit of Formula 1, or consisting of the unit. However, when the neutral layer of the present application is applied, appropriate vertical orientation characteristics can also be realized for the block copolymer as above.

As the block copolymer comprises the unit of Formula 1 above, the self-assembled structure on the above-mentioned neutral layer may exhibit excellent phase separation characteristics and may be vertically oriented, while forming a regular structure such as a lamellar shape or a cylinder shape.

In the block copolymer, the kind of the second block included together with the first block is not particularly limited. For example, as the second block, a polyvinyl pyrrolidone block, a polylactic acid block, a polyvinyl pyridine block, a polystyrene block such as polystyrene or polytrimethylsilyl styrene, a poly(perfluorostyrene) block such as poly(2,3,4,5,6-pentafluorostyrene), a poly(meth)acrylate block such as poly(methylmethacrylate), a polyalkylene oxide block such as polyethylene oxide, a polybutadiene block, a polyisoprene block, or a polyolefin block such as polyethylene can be exemplified.

As the second block, the block comprising the above-described unit of Formula 4, and the like, or consisting of the unit may also be used.

The block copolymer of the present application may be a diblock copolymer including the first block and the second block as described above, or a multi-block copolymer including two or more of at least one of the first block and the second block, or another kind of a third block.

The number average molecular weight (Mn) of the block copolymer may be in a range of, for example, 2,000 to 500,000. The block copolymer may have polydispersity (Mw/Mn) in a range of 1.01 to 1.50. In another example, the number average molecular weight of the block copolymer may be about 3,000 or more, 4,000 or more, 5,000 or more, 6,000 or more, 7,000 or more, 8,000 or more, 9,000 or more, 10,000 or more, 15,000 or more, 20,000 or more, 25,000 or more, 30,000 or more, 40,000 or more, 45,000 or more, 50,000 or more, 55,000 or more, 60,000 or more, 65,000 or more, 70,000 or more, 75,000 or more, 80,000 or more, 85,000 or more, 90,000 or more, 95,000 or more, 100,000 or more, 110,000 or more, 120,000 or more, 130,000 or more, 140,000 or more, 150,000 or more, 160,000 or more, 170,000 or more, 180,000 or more, 190,000 or more, 200,000 or more, 210,000 or more, 220,000 or more, 230,000 or more, 240,000 or more, 250,000 or more, 260,000 or more, 270,000 or more, 280,000 or more, 290,000 or more, 300,000 or more, 310,000 or more, 320,000 or more, 330,000 or more, 340,000 or more, 350,000 or more, 360,000 or more, 370,000 or more, 380,000 or more, 390,000 or more, 400,000 or more, 410,000 or more, 420,000 or more, 430,000 or more, 440,000 or more, 450,000 or more, 460,000 or more, 470,000 or more, 480,000 or more, or 490,000 or more, or may be 490,000 or less, 480,000 or less, 470,000 or less, 460,000 or less, 450,000 or less, 440,000 or less, 430,000 or less, 420,000 or less, 410,000 or less, 400,000 or less, 390,000 or less, 380,000 or less, 370,000 or less, 360,000 or less, 350,000 or less, 340,000 or less, 330,000 or less, 320,000 or less, 310,000 or less, 300,000 or less, 290,000 or less, 280,000 or less, 270,000 or less, 260,000 or less, 250,000 or less, 240,000 or less, 230,000 or less, 220,000 or less, 210,000 or less, 200,000 or less, 190,000 or less, 180,000 or less, 170,000 or less, 160,000 or less, 150,000 or less, 140,000 or less, 130,000 or less, 120,000 or less, 110,000 or less, 100,000 or less, 90,000 or less, 80,000 or less, 70,000 or less, 60,000 or less, 50,000 or less, 40,000 or less, 30,000 or less, 20,000 or less, 10,000 or less, 9,000 or less, 8,000 or less, 7,000 or less, 6,000 or less, 5,000 or less, 4,000 or less, or 3,000 or less.

In this range, the block copolymer can exhibit proper self-assembly characteristics. The number average molecular weight of the block copolymer and the like can be adjusted in consideration of the desired self-assembly structure and the like When the block copolymer comprises at least the first and second blocks, the first block, for example, the block including the unit of Formula 1 as described above, in the block copolymer may have a ratio in the range of 10 mol % to 90 mol %.

In another example, the block copolymer may comprise about 50 to about 5,000 parts by weight of the second block relative to 100 parts by weight of the first block. In another example, the ratio of the second block may be about 100 or more, 150 or more, 200 or more, 250 or more, 300 or more, 350 or more, 400 or more, 450 or more, 500 or more, 550 or more, 600 or more, 650 or more, 700 or more, 750 or more, 800 or more, 850 or more, or may be about 4,000 or less, 3,500 or less, 3,000 or less, 2,500 or less, 2,000 or less, or 1,000 or less.

Here, the first block may be a block comprising the above-described unit of Formula 1, or consisting of the unit, and the second block may be a block comprising the unit of Formula 4, or consisting of the unit.

The specific method for producing the block copolymer in the present application is not particularly limited as long as it comprises the step of forming at least one block of the block copolymer using the above-mentioned monomer.

For example, the block copolymer can be prepared by the LRP (Living Radical Polymerization) method using the above monomers. For example, there are anion polymerization in which polymerization is carried out in the presence of an inorganic acid salt such as an alkali metal or alkaline earth metal salt or an organoaluminum compound using an organic rare earth metal complex or an organic alkali metal compound as an initiator, an atom transfer radical polymerization method (ATRP) using an atom transfer radical polymerization agent as a polymerization inhibitor, an ARGET (Activators Regenerated by Electron Transfer) atom transfer radical polymerization method (ATRP), which uses an atom transfer radical polymerization agent as a polymerization initiator, but performs polymerization under an organic or inorganic reducing agent that generates electrons, an ICAR (Initiators for Continuous Activator Regeneration) atom transfer radical polymerization method, a polymerization method by reversible addition-fragmentation chain transfer (RAFT) using an inorganic reducing agent and a reversible addition-fragmentation chain transfer agent or a method of using an organotellurium compound as an initiator, and the like, and a suitable method may be selected and applied among the above methods.

For example, the block copolymer can be prepared in a manner which comprises polymerizing a reactant containing monomers capable of forming the block in the presence of a radical initiator and a living radical polymerization reagent by the living radical polymerization method.

The method for forming other blocks included in the copolymer, together with the block formed by using the monomer, upon producing the block copolymer is not particularly limited, and the other blocks may be formed by selecting a suitable monomer in consideration of the kind of the desired block.

The process for preparing the block copolymer may further comprise, for example, a step of precipitating the polymerization product produced through the above process in the non-solvent.

The kind of the radical initiator is not particularly limited, may be appropriately selected in consideration of the polymerization efficiency, and for example, an azo compound such as AIBN (azobisisobutyronitrile), ABCN (1,1'-azobis(cyclohexanecarbonitrile)) or 2,2'-azobis-(2,4-dimethylvaleronitrile), or peroxide series such as BOP (benzoyl peroxide) or DTBP (di-t-butyl peroxide) may be used.

The living radical polymerization process can be carried out in a solvent such as, for example, methylene chloride, 1,2-dichloroethane, chlorobenzene, dichlorobenzene, benzene, toluene, acetone, chloroform, tetrahydrofuran, dioxane, monoglyme, diglyme, dimethylformamide, dimethylsulfoxide or dimethylacetamide.

As the non-solvent, an alcohol such as methanol, ethanol, normal propanol or isopropanol, a glycol such as ethylene glycol, ether series such as n-hexane, cyclohexane, n-heptane or petroleum ether, and the like can be used, but is not limited thereto.

The method for forming the polymer membrane as above using the block copolymer is not particularly limited. For example, the method may comprise forming the polymer membrane comprising the block copolymer, in a self-assembled state, on the neutral layer. For example, the method may comprise a process of forming a layer of the block copolymer or a coating liquid in which the block copolymer is diluted in an appropriate solvent, on the neutral layer by application or the like and, if necessary, annealing or heat-treating the layer.

The annealing or heat treatment may be performed, for example, based on the phase transition temperature or the glass transition temperature of the block copolymer, and for example, may be performed at a temperature above the glass transition temperature or the phase transition temperature. The time for performing this heat treatment is not particularly limited, and the heat treatment can be performed within a range of, for example, about 1 minute to 72 hours, but this can be changed as needed. In addition, the heat treatment temperature of the polymer thin membrane may be, for example, 100° C. to 250° C. or so, but this can be changed in consideration of the block copolymer to be used.

In another example, the formed layer may be also subjected to solvent annealing in a non-polar solvent and/or a polar solvent at room temperature for about 1 minute to 72 hours.

The present application also relates to a pattern forming method. The method may comprise, for example, selectively removing the first or second block of the block copolymer from the polymer membrane of the laminate. The method may be a method for forming a pattern on the substrate. For example, the method may comprise forming the polymer membrane comprising the block copolymer on the substrate, selectively removing one or more blocks of the block copolymer present in the membrane, and then etching the substrate. In this way, it is possible to form, for example, nanoscale fine patterns. In addition, various types of patterns such as nanorods or nanoholes can be formed through the above method depending on the type of the block copolymer in the polymer membrane. If necessary, the block copolymer may be mixed with other copolymers or homopolymers for pattern formation. The type of the substrate to be applied to this method is not particularly limited, which may be selected as needed, and for example, silicon oxide or the like may be applied.

For example, the method can form a nanoscale pattern of silicon oxide that exhibits a high aspect ratio. For example, after forming the polymer membrane on silicon oxide and selectively removing any one block of the block copolymer in a state where the block copolymer in the polymer membrane forms a predetermined structure, silicon oxide may be etched in various ways, for example, reactive ion etching or the like to embody various shapes including patterns of nanorods or nanoholes. In addition, it is possible to embody nano patterns having a large aspect ratio through this method.

For example, the pattern can be implemented on a scale of several tens of nanometers, and such a pattern can be utilized in various applications including, for example, next-generation information electronic magnetic recording media and the like.

Here, the method for selectively removing any one block of the block copolymer is not particularly limited, and for example, a method for removing a relatively soft block by irradiating the polymer membrane with an appropriate electromagnetic wave, for example, ultraviolet and the like can be used. In this case, the ultraviolet irradiation conditions are determined depending on the type of block of the block copolymer, and for example, the method can be performed, for example, by irradiating it with ultraviolet having a wavelength of about 254 nm for 1 minute to 60 minutes.

In addition, the ultraviolet irradiation may be followed by a step of treating the polymer membrane with an acid or the like to further remove the segment decomposed by ultraviolet.

In addition, the step of etching the substrate using a mask the polymer membrane, in which the block is selectively removed, is not particularly limited, which may be performed, for example, through the reactive ion etching step using $CF_4$/Ar ions or the like, and following this process, a step of removing the polymer membrane from the substrate by an oxygen plasma treatment or the like can be also performed.

Advantageous Effects

The present disclosure can provide a neutral layer composition capable of forming a neutral layer. The neutral layer can be effectively applied to formation of a polymer membrane comprising a vertically oriented self-assembled block copolymer. The neutral layer composition is capable of imparting various functions to the neutral layer by maintaining neutrality even when containing a large amount of functional monomer.

Mode for Invention

Hereinafter, the present application will be described more in detail by way of examples according to the present application and comparative examples, but the scope of the present application is not limited to the following examples.

1. NMR Measurement

The NMR analysis was performed at room temperature using an NMR spectrometer including a Varian Unity Inova (500 MHz) spectrometer with a triple resonance 5 mm probe. An analyte was diluted in a solvent for measuring NMR ($CDCl_3$) to a concentration of about 10 mg/ml and used, and chemical shifts were expressed in ppm.

Application Abbreviations br=wide signal, s=singlet, d=doublet, dd=double doublet, t=triplet, dt=double triplet, q=quartet, p=quintet, m=muliplet.

2. GPC (Gel Permeation Chromatograph)

The number average molecular weight (Mn) and the molecular weight distribution were measured using GPC (Gel Permeation Chromatography). Polymer materials to be measured were introduced into a 5 mL vial and diluted in THF (tetrahydrofuran) so as to be a concentration of about 1 mg/mL. Subsequently, the calibration standard sample and the sample to be analyzed were filtered through a syringe filter (pore size: 0.45 μm) and then measured. As an analytical program, ChemStation from Agilent Technologies was used, and the elution time of the sample was compared with the calibration curve to obtain the weight average molecular weight (Mw) and the number average molecular weight (Mn), respectively, and to calculate the molecular weight distribution (PDI) from the ratio (Mw/Mn). The measurement conditions of GPC are as follows.

<GPC Measurement Conditions>

Devices: 1200 series from Agilent Technologies

Column: using two PLgel mixed B from Polymer laboratories

Solvent: THF

Column temperature: 35° C.

Sample concentration: 1 mg/mL, 200 L injection

Standard samples: polystyrene (Mp: 3900000, 723000, 316500, 52200, 31400, 7200, 3940, 485)

Preparation Example 1. Synthesis of Monomer (A)

The compound (DPM-C12) of Formula A below was synthesized in the following manner. Hydroquinone (10.0 g, 94.2 mmol) and 1-bromododecane (23.5 g, 94.2 mmol) were placed in a 250 mL flask, dissolved in 100 mL of acetonitrile, and then an excess amount of potassium carbonate was added thereto and reacted at 75° C. for about 48 hours under a nitrogen condition. After the reaction, the remaining potassium carbonate was filtered off and the acetonitrile used in the reaction was also removed. A mixed solvent of DCM (dichloromethane) and water was added thereto to work up the mixture, and the separated organic layers were collected and passed through $MgSO_4$ to be dehydrated. Subsequently, the target product (4-dodecyloxyphenol) (9.8 g, 35.2 mmol) in a white solid phase was obtained in a yield of about 37% using dichloromethane in column chromatography.

NMR Analysis Results $^1$H-NMR ($CDCl_3$): δ6.77 (dd, 4H); δ4.45 (s, 1H); δ3.89 (t, 2H); δ4.75 (p, 2H); δ4.43 (p, 2H); δ4.33-1.26 (m, 16H); δ 0.88 (t, 3H).

The synthesized 4-docecyloxyphenol (9.8 g, 35.2 mmol), methacrylic acid (6.0 g, 69.7 mmol), DCC (dicyclohexylcarbodiimide) (10.8 g, 52.3 mmol) and DMAP (p-dimethylaminopyridine) (1.7 g, 13.9 mmol) were placed in the flask and 120 mL of methylene chloride was added thereto, and then reacted at room temperature for 24 hours under nitrogen. After completion of the reaction, the salt (urea salt) generated during the reaction was filtered off and the remaining methylene chloride was also removed. Impurities were removed using hexane and DCM (dichloromethane) as the mobile phase in column chromatography and the product obtained again was recrystallized in a mixed solvent of methanol and water (1:1 mix) to obtain the target product (7.7 g, 22.2 mmol) in a white solid phase in a yield of 63%.

NMR Analysis Results $^1$H-NMR (CDCl$_3$): δ7.02 (dd, 2H); δ6.89 (dd, 2H); δ6.32 (dt, 1H); δ5.73 (dt, 1H); δ3.94 (t, 2H); δ2.05 (dd, 3H); δ4.76 (p, 2H); δ4.43 (p, 2H); 1.34-1.27 (m, 16H); δ0.88 (t, 3H).

[Formula A]

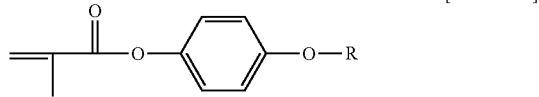

In Formula A, R is a linear alkyl group having 12 carbon atoms.

Preparation Example 2. Synthesis of Block Copolymer 2.0 g of the monomer (A) of Preparation Example 1, 64 mg of cyanoisoproyl dithiobenzoate as an RAFT (reversible addition-fragmentation chain transfer) reagent, 23 mg of AIBN (azobisisobutyronitrile) as a radical initiator and 5.34 mL of benzene were placed in a 10 mL Schlenk flask and stirred at room temperature for 30 minutes under a nitrogen atmosphere, and then an RAFT (reversible addition-fragmentation chain transfer) polymerization reaction was performed at 70° C. for 4 hours. After the polymerization, the reaction solution was precipitated in 250 mL of methanol as an extraction solvent, and then filtered under reduced pressure and dried to prepare a pink macro initiator. The yield of the macro initiator was about 82.6 wt % and the number average molecular weight (Mn) and molecular weight distribution (Mw/Mn) were 9,000 and 1.16, respectively. 0.3 g of the macro initiator, 2.7174 g of a pentafluorostyrene monomer (monomer B) and 1.306 mL of benzene were placed in a 10 mL Schlenk flask and stirred at room temperature for 30 minutes under a nitrogen atmosphere, and then an RAFT (reversible addition-fragmentation chain transfer) polymerization reaction was performed at 115° C. for 4 hours. After the polymerization, the reaction solution was precipitated in 250 mL of methanol as an extraction solvent, and then filtered under reduced pressure and dried to prepare a pale pink block copolymer.

Preparation Example 3. Synthesis of Random Copolymer 0.97 g of the compound (DPM-C12, monomer A) of Preparation Example 1, 1.36 g of pentafluorostyrene (Monomer B), 0.03 g of glycidyl methacrylate (monomer C), 0.03 g of AIBN (azobisisobutyronitrile) and 2 mL of tetrahydrofuran (THF) were placed in a 10 mL flask (Schlenk flask), and free radical polymerization was performed at 60° C. for 12 hours under a nitrogen atmosphere. After the polymerization, the reaction solution was precipitated in 250 mL of methanol as an extraction solvent, and then dried after filtering under reduced pressure to prepare a random copolymer. The number average molecular weight (Mn) and the molecular weight distribution (Mw/Mn) of the random copolymer were 51,300 g/mol and 2.07, respectively.

Preparation Examples 3 to 8

A random copolymer was prepared in the same manner as in Preparation Example 3, except that the contents of the monomer A represented by Formula A in Preparation Example 1, the monomer B derived from a pentafluorostyrene monomer, the monomer C containing a crosslinkable functional group, and an additional monomer D were adjusted as in Table 1 below.

TABLE 1

| | | Monomer A (mol %) | Monomer B (mol %) | Monomer C (mol %) | Monomer D (mol %) |
|---|---|---|---|---|---|
| Preparation Example | 3 | 28 | 70 | 2 | — |
| | 4 | 18 | 80 | 2 | — |
| | 5 | 13 | 85 | 2 | — |
| | 6 | 11 | 59 | 30 | — |
| | 7 | 11 | 59 | 10 | 20 |
| | 8 | 33 | 65 | 2 | — |
| | 9 | 8 | 90 | 2 | |

Monomer A: compound of Formula A in Preparation Example 1
Monomer B: pentafluorostyrene
Monomer C: glycidyl methacrylate
Monomer D: gammabutyrolactone methacrylate Example 1

Using the block copolymer of Preparation Example 2 and the random copolymer of Preparation Example 3, a crosslinked neutral layer and a self-assembled polymer membrane were each formed and their results were confirmed. Specifically, first, the random copolymer of Preparation Example 3 was dissolved in fluorobenzene at a concentration of about 0.5 wt %, the prepared coating solution was spin-coated on a silicon wafer at a speed of 3000 rpm for 60 seconds, and then the crosslinked neutral layer was formed through thermal crosslinking at about 200° C. The block copolymer of Preparation Example 2 was dissolved in fluorobenzene at a concentration of about 1.0 wt %, the prepared coating solution was spin-coated on the neutral layer at a speed of 3000 rpm for 60 seconds, and then the membrane comprising the self-assembled block copolymer was formed through thermal annealing at about 200° C.

Examples 2 to 6

A membrane comprising a block copolymer was formed under the same conditions as those of Example 1, except that the random copolymers of Preparation Examples 4 to 7, in which the ratios were adjusted as in Table 1 above, were used, respectively.

Comparative Examples 1 and 2

A membrane containing a block copolymer was formed under the same conditions as those of Example 1, except that the random copolymers of Preparation Examples 8 and 9, in which the ratios were adjusted as in Table 1 above, were used.

Figure 2:
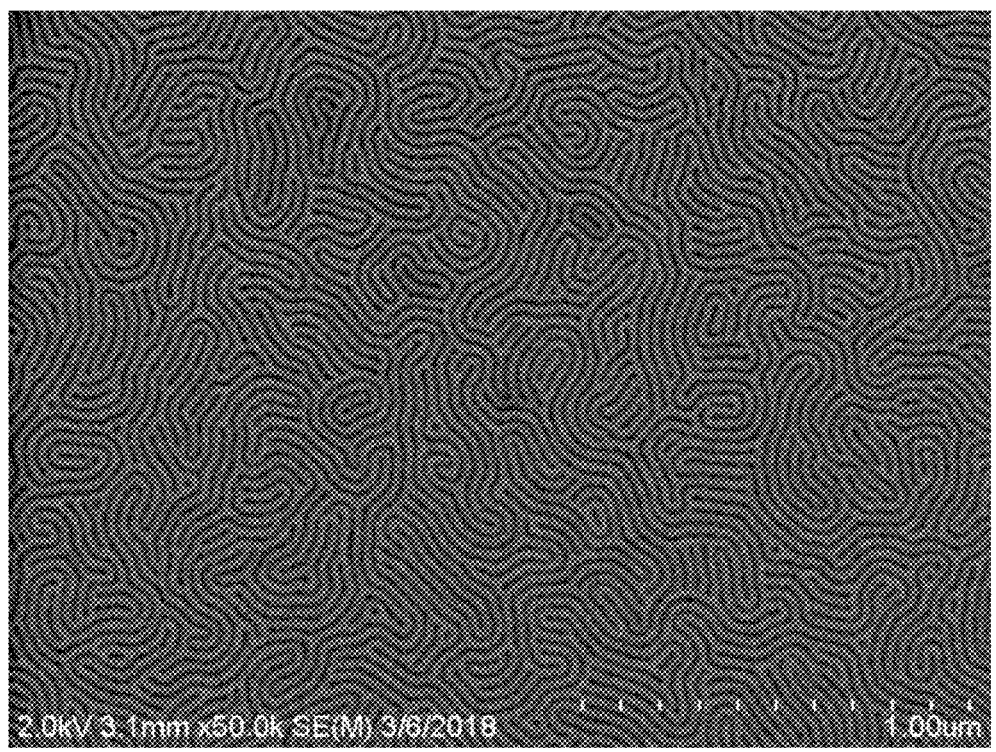
Figure 3:
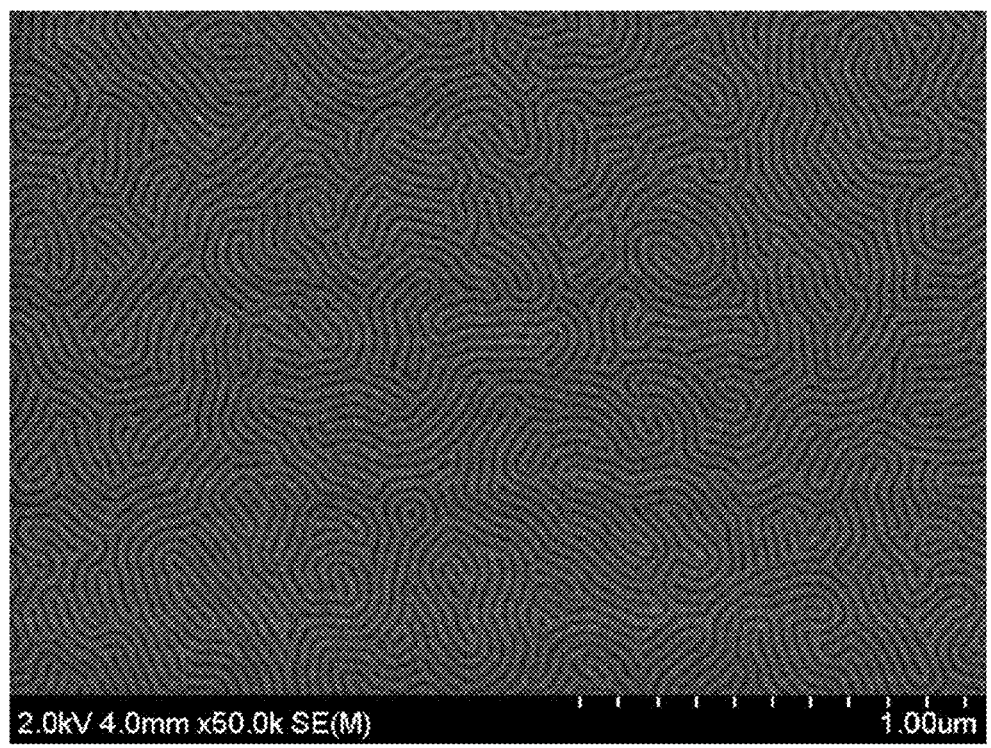
Figure 4:
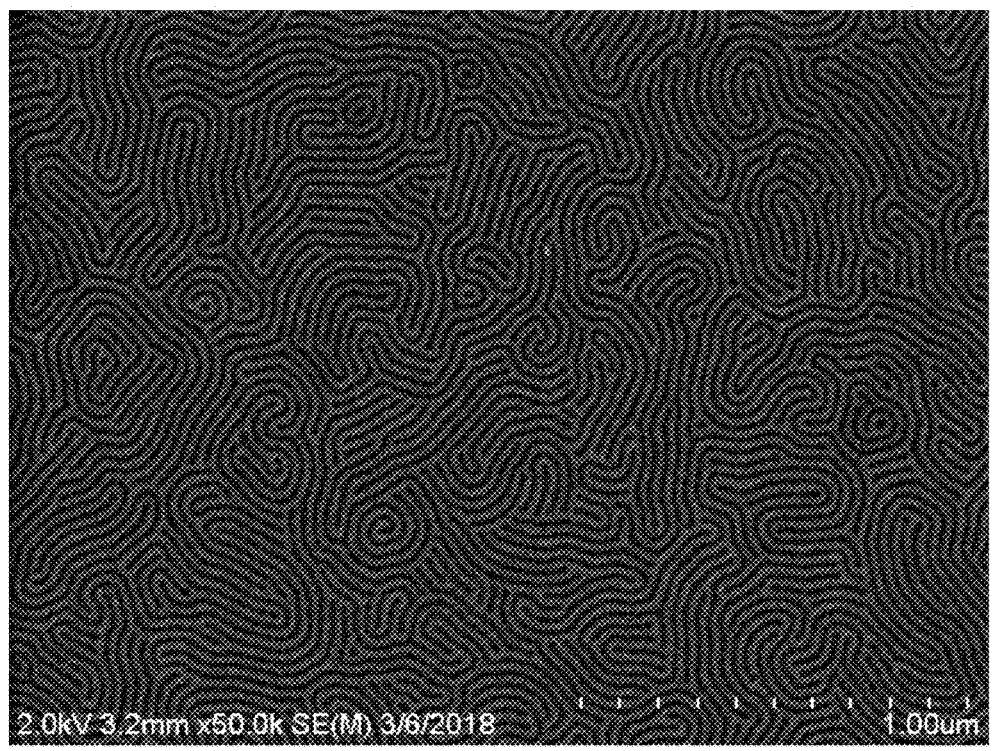
Figure 5:
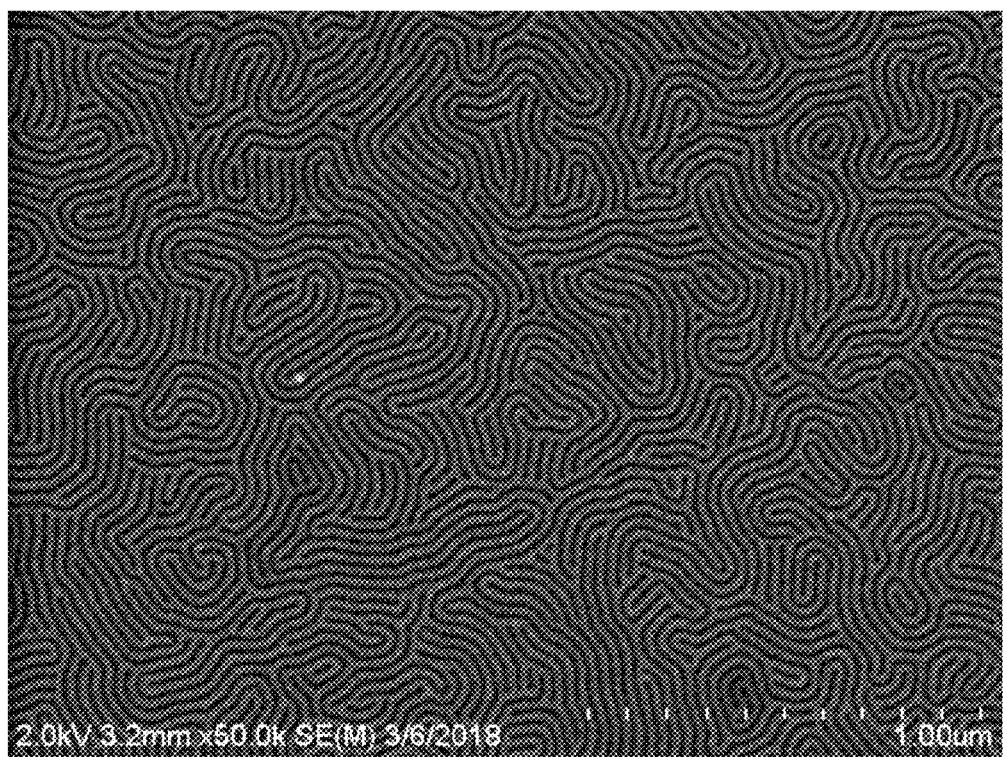
Figure 6:
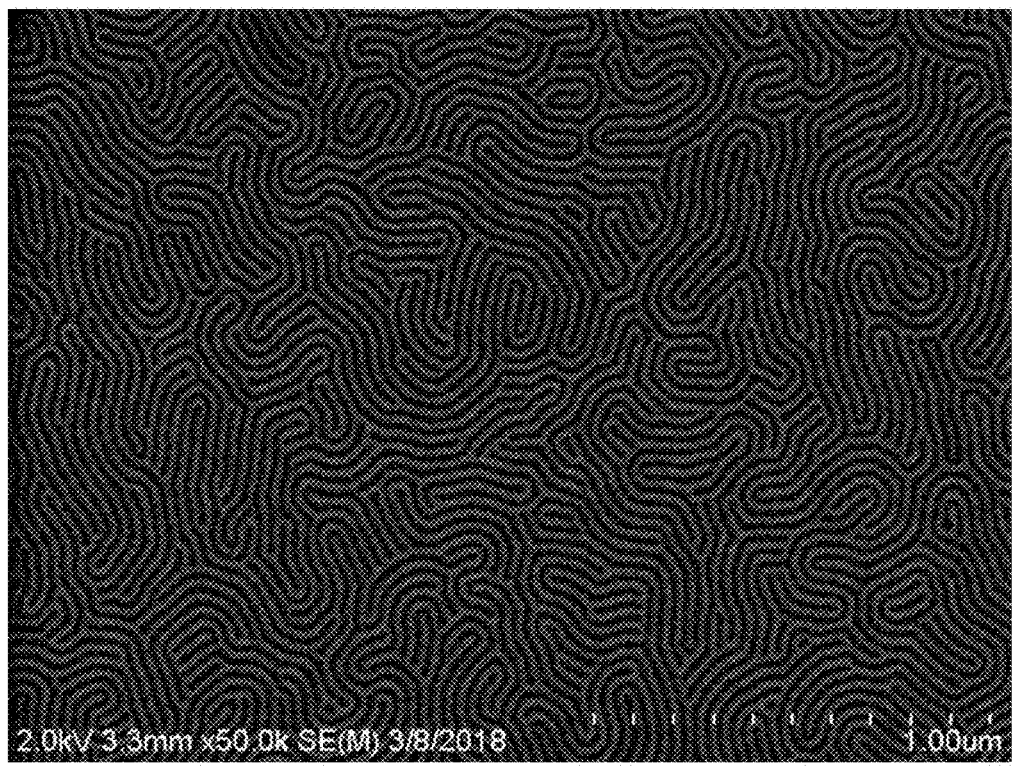

FIGS. 1 to 6 are upper SEM images of the polymer membranes formed in Examples 1 to 6, respectively. The drawings are images that are typically observed when a vertically oriented lamellar pattern is formed, so that it can be confirmed from these that an appropriate orientation is made in the examples.

Figure 7A:
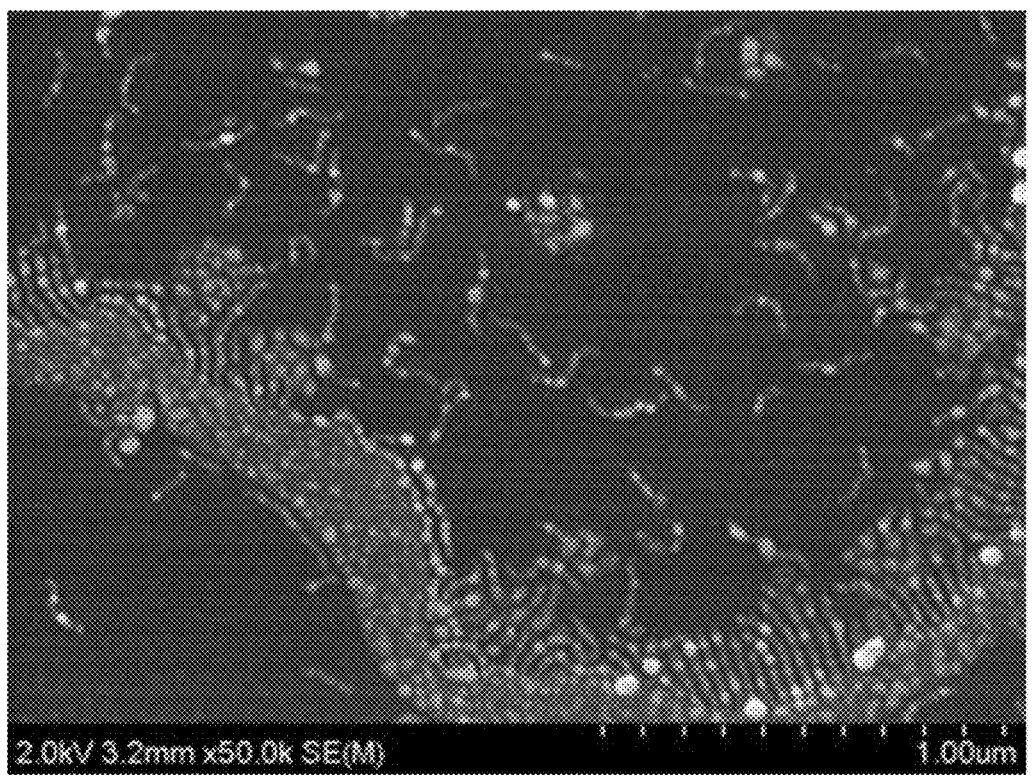
FIGS. 7A-B are SEM images of the block copolymer membranes in Comparative Example 1, and shown top down and side views, respectively.
Figure 7B:
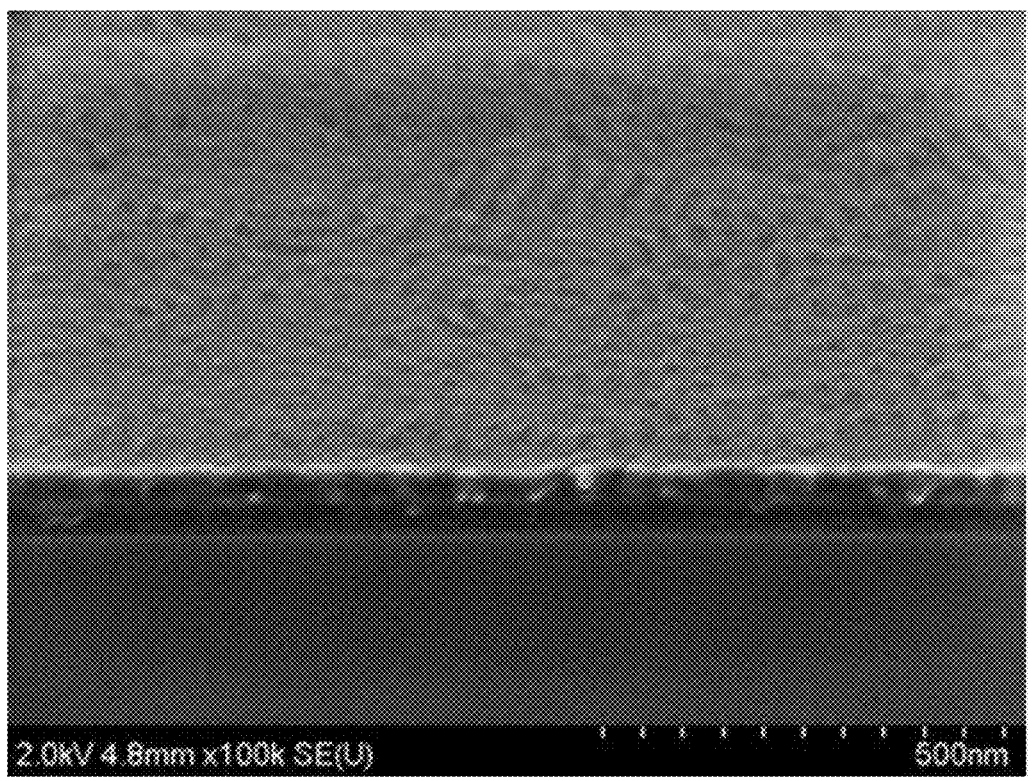
Figure 8A:
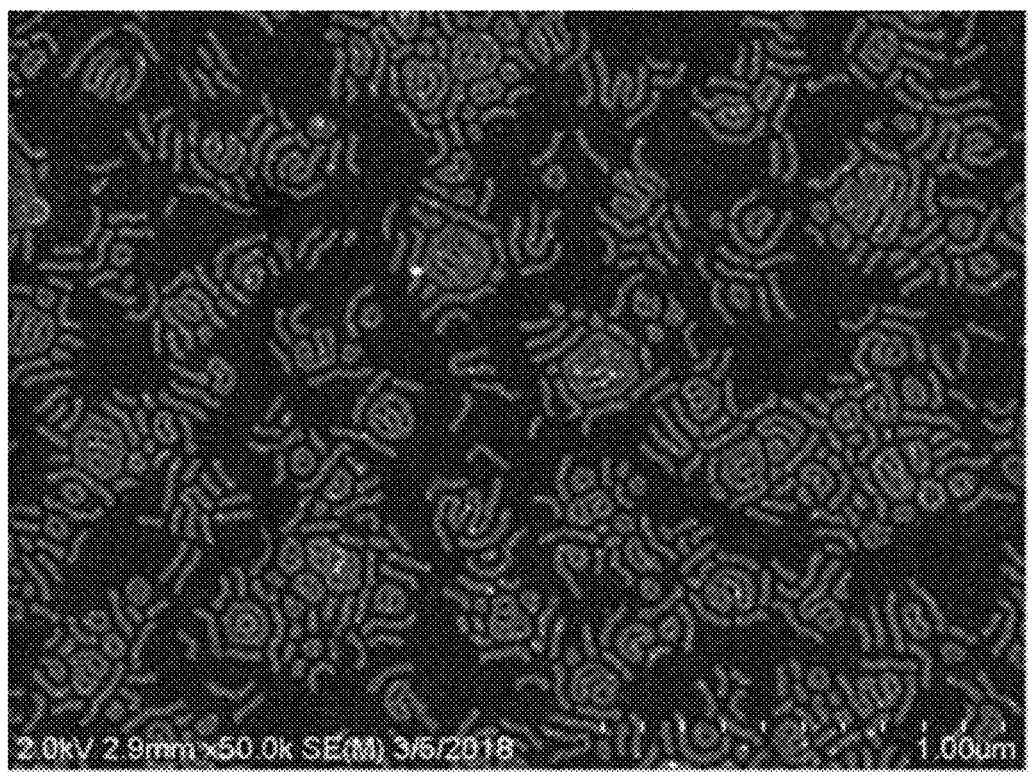
FIGS. 8A-B are SEM images of the block copolymer membranes in Comparative Example 2, and shown top down and side views, respectively.
Figure 8B:
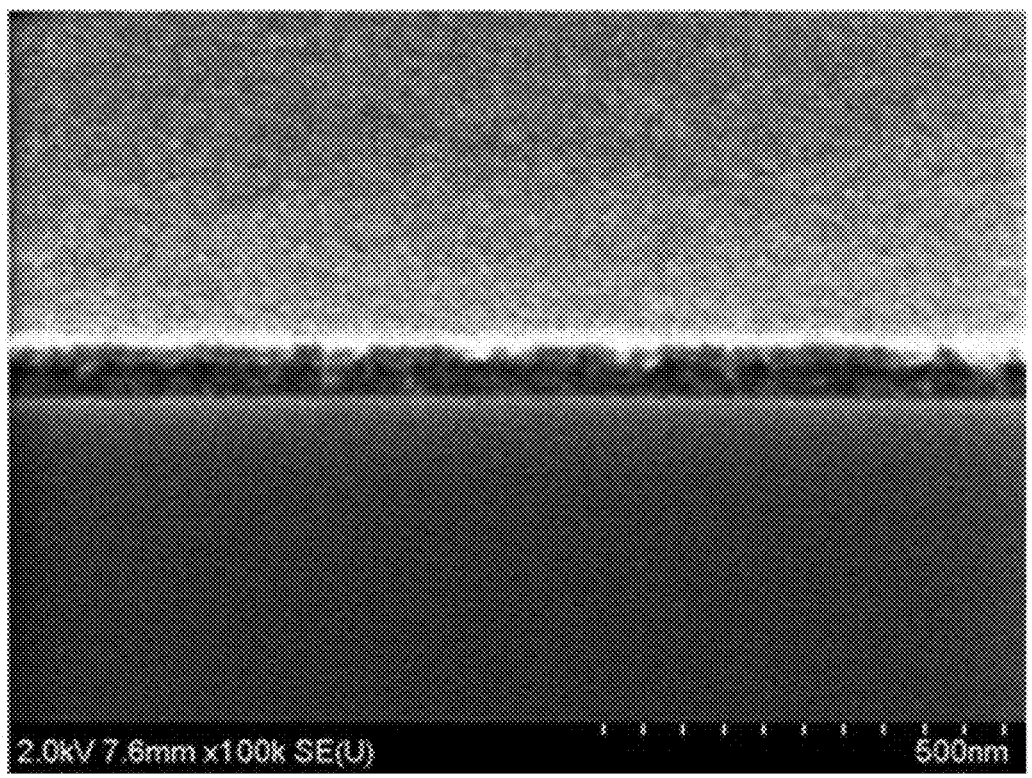

FIGS. 7A-B and 8A-B are for Comparative Examples 1 and 2, respectively, where it can be seen from the upper SEMs (FIGS. 7A, 8A) that the formation efficiency of the lamellar structure is lowered and it can be confirmed from the side views (FIGS. 7B, 8B) that the vertical orientation characteristics are not ensured as well.

The invention claimed is:

1. A neutral layer composition, comprising:
a random copolymer having a unit represented by Formula 1, and a unit containing an aromatic structure having three or more halogen atoms,
wherein the unit represented by Formula 1 is present in a range of 9 mol % to 32 mol %, based on a total molar amount of the copolymer:

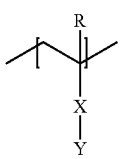

[Formula 1]

wherein in Formula 1, R is hydrogen or an alkyl group having 1 to 4 carbon atoms, X is a single bond, an oxygen atom, a sulfur atom, —S(=O)$_2$—, a carbonyl group, an alkylene group, an alkenylene group, an alkynylene group, —C(=O)—X$_1$— or —X$_1$—C(=O)—, where X$_1$ is an oxygen atom, a sulfur atom, —S(=O)$_2$—, an alkylene group, an alkenylene group or an alkynylene group, and Y is a monovalent substituent including a ring structure to which a chain having 8 or more chain-forming atoms is connected,
wherein the unit having an aromatic structure containing three or more halogen atoms is represented by Formula 4:

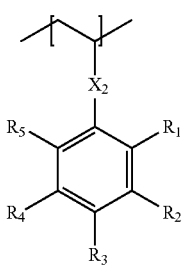

[Formula 4]

wherein, X$_2$ is a single bond, an oxygen atom, a sulfur atom, —S(=O)$_2$—, an alkylene group, an alkenylene group, an alkynylene group, —C(=O)—X$_1$— or —X$_1$—C(=O)$_2$—, where X$_1$ is a single bond, an oxygen atom, a sulfur atom, —S(=O)$_2$—, an alkylene group, an alkenylene group or an alkynylene group, and R$_1$ to R$_5$ are each independently hydrogen, an alkyl group, a haloalkyl group or a halogen atom, where a number of the halogen atoms contained in R$_1$ to R$_5$ is three or more.

2. The neutral layer composition according to claim 1, wherein X is an oxygen atom, a carbonyl group, —C(=O)—O— or —O—C(=O)—.

3. The neutral layer composition according to claim 1, wherein the chain comprises 8 to 20 chain-forming atoms.

4. The neutral layer composition according to claim 1, wherein the chain-forming atoms are carbon, oxygen, nitrogen or sulfur.

5. The neutral layer composition according to claim 1, wherein the chain is a hydrocarbon chain.

6. The neutral layer composition according to claim 1, wherein the ring structure of Y is an aromatic ring structure.

7. The neutral layer composition according to claim 1, wherein a ratio (A/D) of a number of moles (D) of the unit represented by Formula 1 and a number of moles (A) of the unit having an aromatic structure containing three or more halogen atoms is in a range of 2 to 10.

8. The neutral layer composition according to claim 1, wherein the random copolymer further comprises a unit having a crosslinkable functional group.

9. The neutral layer composition according to claim 8, wherein the crosslinkable functional group is a hydroxyl group, an epoxy group, an isocyanate group, a glycidyl group, a substituent of Formula 5, a benzoylphenoxy group, an alkenyloxycarbonyl group, a (meth)acryloyl group, or an alkenyloxyalkyl group:

$$-X-Y-N_3$$ [Formula 5]

wherein in Formula 5, Y is a single bond, an alkylene group, an alkenylene group or an alkynylene group, X is a single bond, an oxygen atom, a sulfur atom, —S(=O)$_2$—, an alkylene group, an alkenylene group, alkynylene group, —C(=O)—X$_1$— or —X$_1$—C(=O)—, where X$_1$ is a single bond, an oxygen atom, a sulfur atom, —S(=O)$_2$—, an alkylene group, an alkenylene group or an alkynylene group, and N$_3$ is a cross-linkable azide residue.

10. The neutral layer composition according to claim 8, wherein the unit containing a crosslinkable functional group is present in a molar amount of 40 mol % or less, based on a total molar amount of the random copolymer.

11. The neutral layer composition according to claim 8, wherein a ratio (C/D) of a number of moles (D) of the unit represented by Formula 1 and a number of moles (C) of the unit having a crosslinkable functional group is in a range of 0.05 to 4.

12. A neutral layer, comprising:
a random copolymer comprising a unit represented by Formula 1, and a unit having an aromatic structure containing three or more halogen atoms,
wherein a molar amount of the unit represented by Formula 1 is present in a range of 9 mol % to 32 mol %, based on a total molar amount of the random copolymer:

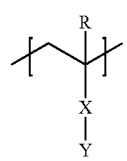

[Formula 1]

wherein in Formula 1, R is hydrogen or an alkyl group having 1 to 4 carbon atoms, X is a single bond, an oxygen atom, a sulfur atom, —S(=O)$_2$—, a carbonyl group, an alkylene group, an alkenylene group, an alkynylene group, —C(=O)—X$_1$— or —X$_1$—C(=O)—, where X$_1$ is an oxygen atom, a sulfur atom, —S(=O)$_2$—, an alkylene group, an alkenylene group or an alkynylene group, and Y is a monovalent substituent including a ring structure to which a chain having 8 or more chain-forming atoms is connected, wherein the unit having an aromatic structure containing three or more halogen atoms is represented by Formula 4:

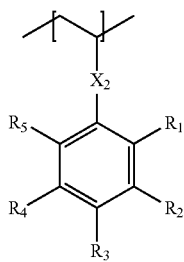

[Formula 4]

wherein, X$_2$ is a single bond, an oxygen atom, a sulfur atom, —S(=O)$_2$—, an alkylene group, an alkenylene group, an alkynylene group, —C(=O)—X$_1$— or —X$_1$—C(=O)$_2$—, where X$_1$ is a single bond, an oxygen atom, a sulfur atom, —S(=O)$_2$—, an alkylene group, an alkenylene group or an alkynylene group, and R$_1$ to R$_5$ are each independently hydrogen, an alkyl group, a haloalkyl group or a halogen atom, where a number of the halogen atoms contained in R$_1$ to R$_5$ is three or more.

13. A method for forming a neutral layer, comprising:
coating the neutral layer composition of claim 1 on a substrate; and
fixing the layer to the substrate.

14. A laminate, comprising:
the neutral layer of claim 12; and
a polymer membrane disposed on one surface of the neutral layer, wherein the polymer membrane containing a block copolymer having a first block and a second block chemically distinguishable from the first block.

15. The laminate according to claim 14, wherein the first block of the block copolymer comprises a unit of Formula 1.

16. A method for preparing a laminate, comprising:
forming a polymer membrane on one surface of the neutral layer of claim 12, wherein the polymer membrane contains a block copolymer having a first block and a second block chemically distinguishable from the first block, and wherein the block copolymer is in a self-assembled state.

17. A pattern forming method, comprising:
selectively removing the first or second block of the block copolymer from the polymer membrane in the laminate of claim 16.

* * * * *